(12) United States Patent
He et al.

(10) Patent No.: US 8,362,592 B2
(45) Date of Patent: Jan. 29, 2013

(54) TILED SUBSTRATES FOR DEPOSITION AND EPITAXIAL LIFT OFF PROCESSES

(75) Inventors: Gang He, Sunnyvale, CA (US); Andreas Hegedus, Burlingame, CA (US)

(73) Assignee: Alta Devices Inc., Santa Clara (*) Notice: Subject to any disclaimer, the term of this patent is extended or adjusted under 35 U.S.C. 154(b) by 234 days.

(21) Appl. No.: 12/715,243

(22) Filed: Mar. 1, 2010

(65) Prior Publication Data

US 2010/0219509 A1 Sep. 2, 2010

Related U.S. Application Data

(60) Provisional application No. 61/156,404, filed on Feb. 27, 2009.

(51) Int. Cl.
*H01L 29/06* (2006.01)
(52) U.S. Cl. .................. 257/618; 438/458; 257/E21.09
(58) Field of Classification Search .............. 257/618, 257/E21.09, E21.092, E21.097, E21.098, 257/E21.1–E21.101, E21.102, E29.089; 438/458
See application file for complete search history.

(56) References Cited

U.S. PATENT DOCUMENTS

| | | |
|---|---|---|
| 3,993,533 A | 11/1976 | Milnes et al. |
| 4,445,965 A | 5/1984 | Milnes |
| 4,727,047 A | 2/1988 | Bozler et al. |
| 4,846,931 A | 7/1989 | Gmitter et al. |
| 4,883,561 A | 11/1989 | Gmitter et al. |
| 5,073,230 A | 12/1991 | Maracas et al. |
| 5,122,852 A | 6/1992 | Chang et al. |
| 5,201,996 A | 4/1993 | Gmitter et al. |
| 5,221,637 A | 6/1993 | De Boeck |
| 5,256,562 A | 10/1993 | Vu et al. |
| 5,258,325 A | 11/1993 | Spitzer et al. |
| 5,276,345 A | 1/1994 | Siegel et al. |
| 5,277,749 A | 1/1994 | Griffith et al. |
| 5,286,335 A | 2/1994 | Drabik et al. |
| 5,344,517 A | 9/1994 | Houlding |
| 5,401,983 A | 3/1995 | Jokers et al. |
| 5,458,694 A | 10/1995 | Nuyen |
| 5,465,009 A | 11/1995 | Drabik et al. |
| 5,476,810 A | 12/1995 | Curran |
| 5,479,043 A | 12/1995 | Nuyen |
| 5,528,719 A | 6/1996 | Yamada |

(Continued)

FOREIGN PATENT DOCUMENTS

WO   WO 2006/131316 A1   12/2006

OTHER PUBLICATIONS

Bauhuis, G.J., "Substrate Reuse for Epitaxial Lift-Off of III-V Solar Cells", Proceedings of the 22$^{nd}$ European Photovoltaic Solar Energy Conference: Milan Sep. 3-7, 2007, pp. 106-110.

(Continued)

*Primary Examiner* — Julio J Maldonado
*Assistant Examiner* — Sonya McCall Shepard

(57) ABSTRACT

Embodiments of the invention generally relate to epitaxial lift off (ELO) films and methods for producing such films. Embodiments provide a method to simultaneously and separately grow a plurality of ELO films or stacks on a common support substrate which is tiled with numerous epitaxial growth substrates or surfaces. Thereafter, the ELO films are removed from the epitaxial growth substrates by an etching step during an ELO process. The tiled growth substrate contains the epitaxial growth substrates disposed on the support substrate may be reused to grow further ELO films. In one embodiment, a tiled growth substrate is provided which includes two or more gallium arsenide growth substrates separately disposed on a support substrate having a coefficient of thermal expansion within a range from about $5\times10^{-6}$ $C.^{-1}$ to about $9\times10^{-6}$ $C.^{-1}$.

24 Claims, 8 Drawing Sheets

U.S. PATENT DOCUMENTS

| | | |
|---|---|---|
| 5,546,375 A | 8/1996 | Shimada et al. |
| 5,641,381 A | 6/1997 | Bailey et al. |
| 5,827,751 A | 10/1998 | Nuyen |
| 5,985,742 A | 11/1999 | Henley et al. |
| 6,010,579 A | 1/2000 | Henley et al. |
| 6,071,795 A | 6/2000 | Cheung et al. |
| 6,155,909 A | 12/2000 | Henley et al. |
| 6,214,733 B1 | 4/2001 | Sickmiller |
| 6,221,740 B1 | 4/2001 | Bryan et al. |
| 6,232,136 B1 | 5/2001 | Zavracky et al. |
| 6,263,941 B1 | 7/2001 | Bryan et al. |
| 6,284,631 B1 | 9/2001 | Henley et al. |
| 6,287,891 B1 | 9/2001 | Sayyah |
| 6,290,804 B1 | 9/2001 | Henley et al. |
| 6,291,313 B1 | 9/2001 | Henley et al. |
| 6,294,814 B1 | 9/2001 | Henley et al. |
| 6,346,459 B1 | 2/2002 | Usenko et al. |
| 6,352,909 B1 | 3/2002 | Usenko |
| 6,387,829 B1 | 5/2002 | Usenko et al. |
| 6,391,740 B1 | 5/2002 | Cheung et al. |
| 6,414,783 B2 | 7/2002 | Zavracky et al. |
| 6,458,672 B1 | 10/2002 | Henley et al. |
| 6,486,041 B2 | 11/2002 | Henley et al. |
| 6,500,732 B1 | 12/2002 | Henley et al. |
| 6,504,524 B1 | 1/2003 | Gates et al. |
| 6,511,899 B1 | 1/2003 | Henley et al. |
| 6,513,564 B2 | 2/2003 | Bryan et al. |
| 6,528,391 B1 | 3/2003 | Henley et al. |
| 6,548,382 B1 | 4/2003 | Henley et al. |
| 6,554,046 B1 | 4/2003 | Bryan et al. |
| 6,559,075 B1 | 5/2003 | Kelly et al. |
| 6,589,811 B2 | 7/2003 | Sayyah |
| 6,632,724 B2 | 10/2003 | Henley et al. |
| 6,669,801 B2 | 12/2003 | Yoshimura et al. |
| 6,677,249 B2 | 1/2004 | Laermer et al. |
| 6,740,604 B2 | 5/2004 | Kelly et al. |
| 6,790,747 B2 | 9/2004 | Henley et al. |
| 6,809,044 B1 | 10/2004 | Aspar et al. |
| 6,890,838 B2 | 5/2005 | Henley et al. |
| 6,943,050 B2 | 9/2005 | Kondo |
| 6,974,521 B2 | 12/2005 | Schermer |
| 7,045,878 B2 | 5/2006 | Faris |
| 7,056,808 B2 | 6/2006 | Henley et al. |
| 7,060,591 B2 | 6/2006 | Yamazaki et al. |
| 7,153,761 B1 | 12/2006 | Nastasi et al. |
| 7,160,790 B2 | 1/2007 | Henley et al. |
| 7,163,826 B2 | 1/2007 | Faris |
| 7,198,671 B2 | 4/2007 | Ueda |
| 7,202,141 B2 | 4/2007 | Park et al. |
| 7,229,901 B2 | 6/2007 | Savage et al. |
| 7,241,667 B2 | 7/2007 | Park et al. |
| 7,341,925 B2 | 3/2008 | Kelly et al. |
| 7,348,258 B2 | 3/2008 | Henley et al. |
| 7,638,410 B2 | 12/2009 | Nastasi et al. |
| 2009/0170286 A1* | 7/2009 | Tsukamoto et al. .......... 438/458 |
| 2009/0321881 A1 | 12/2009 | Archer et al. |
| 2009/0321885 A1 | 12/2009 | Archer et al. |
| 2009/0321886 A1 | 12/2009 | Gmitter et al. |
| 2009/0324379 A1 | 12/2009 | He et al. |
| 2009/0325367 A1 | 12/2009 | He et al. |
| 2010/0001316 A1 | 1/2010 | Gmitter et al. |
| 2010/0001374 A1 | 1/2010 | Gmitter et al. |
| 2010/0092668 A1 | 4/2010 | Hegedus |

OTHER PUBLICATIONS

Bauhuis, G.J., "Thin film GaAs solar cells with increased quantum efficiency due to light reflection", Solar Energy Materials & Solar Cells 83 (2004) 81-90, Nov. 3, 2003.

Konagai, Makoto, "High Efficiency GaAs Thin Film Solar Cells by Peeled Film Technology", Journal of Crystal Growth 45 (1978) 277-280.

Kumar, P., "Sacrificial etching of $Al_xGa_{1-x}As$ for III-V MEMS surface micromachining", Appl. Phys. A 88, 711-714, May 24, 2007.

Schermer J.J., "Epitaxial Lift-Off for large area thin film III/V devices", Phys. Stat. Sol. (1) 202, No. 4, 501-508 (2005).

Schermer, J.J., "Photon confinement in high-efficiency, thin-film III-V solar cells obtained by epitaxial life-off", Thin Solid Films 511-512 (2006) 645-653, Jan. 19, 2006.

Schermer, J.J., "Thin-film GaAs Epitaxial Lift-Off Solar Cells for Space Applications", Prog. Photovolt: Res. Appl. 2005; 13:587-596, Apr. 28, 2005.

Schermer J.J., "Solar Cells Based on III-V Semiconductors", Joint Solar Panel, Sep. 29, 2004.

Sickmiller, M., "Packaging of Ultrathin Semiconductor Devices Through the ELO Packaging Process", Mat. Res. Soc. Symp. Proc. vol. 681E (2001).

Van Deelen, J., "On the development of high-efficiency thin-film GaAs and GainP2 cells", Journal of Crystal Growth 298 (2007) 772-776, Nov. 28, 2006.

Van Niftrik, A.T.J., "HF Species and Dissolved Oxygen on the Epitaxial Lift-Off Process of GaAs Using AlAsP Release Layers", Journal of the Electrochemical Society, 155 (1) D35-D39 (2008), Nov. 6, 2007.

Van Niftrik, A.T.J., "A Diffusion and Reaction Related Model of the Epitaxial Lift-Off Process", Journal of the Electrochemical Society, 154 (11) D629-D635 (2007), Sep. 19, 2007.

Van Niftrik, A.T.J., "The influence of $In_xGa_{1-x}As$ and $GaAs_{1-y}P_y$ Layers Surrounding the AlAs Release Layer in the Epitaxial Lift-Off Process", Crystal Growth & Design, 2007, vol. 7, No. 12, 2472-2480, Aug. 7, 2007.

Voncken, M.M.A.J., "Strain-accelerated HF etching of AlAs for epitaxial lift-off", J. Phys.: Condens. Matter 16 (2004) 3585-3596, May 14, 2004.

Voncken, M.M.A.J., "Influence of radius of curvature on the lateral etch rate of the weight induced epitaxial lift-off process", Material Science and Engineering B95 (2002) 242-248, May 21, 2002.

Voncken, M.M.A.J., "Multiple release layer study of the intrinsic lateral etch rate of the epitaxial lift-off process", Appl. Phys. A 79, 1801-1807, Mar. 28, 2003.

Yablonovitch, E., "Van De Waals bonding of GaAs epitaxial liftoff films onto arbitrary substrates", Appl. Phys. Lett. 56 (24), Jun. 11, 1990.

* cited by examiner

TILED SUBSTRATES FOR DEPOSITION AND EPITAXIAL LIFT OFF PROCESSES

CROSS-REFERENCE TO RELATED APPLICATION

This application claims benefit of U.S. Ser. No. 61/156,404, filed Feb. 27, 2009, which is hereby incorporated by reference in its entirety.

BACKGROUND OF THE INVENTION

1. Field of the Invention

Embodiments of the invention generally relate to methods for the fabrication of photovoltaic, semiconductor, and electronic materials and devices, and more particularly relate to epitaxial lift off (ELO) processes and the thin films and devices formed by these process.

2. Description of the Related Art

Photovoltaic or solar devices, semiconductor devices, or other electronic devices are usually manufactured by utilizing a variety of fabrication processes to manipulate the surface of a substrate. These fabrication processes may include deposition, annealing, etching, doping, oxidation, nitridation, and many other processes. Generally, the manufactured devices generally incorporate a portion or the whole base substrate into the final architecture of the electronic device. For example, a photovoltaic device is often formed on a gallium arsenide wafer which is incorporated as an intimate part of the final photovoltaic device. Epitaxial lift off (ELO) is a less common technique for fabricating thin film devices and materials which does not incorporate the base substrate into the final manufactured devices.

The ELO process provides growing an epitaxial layer, film, or material on a sacrificial layer which is disposed on a growth substrate, such as a gallium arsenide wafer. Subsequently, the sacrificial layer is selectively etched away in a wet acid bath, while the epitaxial material is separated from the growth substrate. The isolated epitaxial material is a thin layer or film and is usually referred to as the ELO film or the epitaxial film. Each ELO film generally contains numerous layers of varying compositions relative to the specific device, such as photovoltaic or solar devices, semiconductor devices, or other electronic devices.

The growth substrates are usually crystalline wafers of gallium arsenide or other Group III/V elements. The growth substrates are very fragile and expensive. The growth substrates are so expensive as to be commercially cost prohibiting if incorporated into the finished ELO film or device. Therefore, once the ELO film has been removed, the growth substrates are cleaned, treated, and reused to manufacture additional ELO films. While reusing the growth substrates reduces some cost, the process of refurbishing a growth substrate for each fabricated ELO film is still quite expensive. The growth substrates must be refurbished even if the ELO process does not yield a commercially viable ELO film. Also, since the growth substrates are quite fragile, the likelihood of chipping, cracking, or breaking a substrate increases with each additional step exposed to the growth substrate during the ELO or refurbishing processes. Furthermore, each of the growth substrates has a finite life expectancy even if the substrate is not damaged during the fabrication processes.

While the expense of growth substrates may be one factor which has contributed to the lack of commercial utilization of the ELO process, other factors have also plagued the use of this technique. The overall ELO process has always been a cost prohibiting technique for commercially producing the thin ELO film devices. The throughput is quite low since current ELO processes provide transferring a single growth substrate through many fabrication steps while producing a single ELO film. The current ELO processes are time consuming, costly, and rarely produce commercial quality ELO films.

Therefore, there is a need for a method for growing epitaxial film stacks by ELO processes, and a need for the method to have a high throughput and to be more effective, less time consuming, and less expensive than currently known ELO processes.

SUMMARY OF THE INVENTION

Embodiments of the invention generally relate to epitaxial lift off (ELO) films and methods for producing such films. Embodiments provide a method to simultaneously and separately grow a plurality of ELO films or stacks on a common support substrate which is tiled with numerous epitaxial growth substrates (e.g., epitaxial or crystalline substrates, wafers, or surfaces). Thereafter, the ELO films are removed from the epitaxial growth substrates by an etching step during an ELO process. The overall throughput is quite high since multiple ELO films may be manufactured while exposing each tiled growth substrate to the numerous fabrication processes, similar to a bulk process. However, multiple tiled growth substrates, each containing a plurality of epitaxial growth substrates disposed on a support substrate, may be exposed consecutively or simultaneously to the fabrication processes. The tiled growth substrate containing the epitaxial growth substrates disposed on the support substrate may be reused to grow further ELO films.

Each of the ELO films contains multiple epitaxial layers which are grown by chemical vapor deposition (CVD) on a sacrificial layer disposed on or over each epitaxial growth substrate. A support film, handle, or tape may be disposed on or over the opposite side of the ELO film as the support substrate. The support film is used to stabilize the ELO films by maintaining compression and to hold the ELO films during the etching and removal steps of the ELO process, and thereafter.

The epitaxial growth substrates are a crystalline material usually of a Group III/V compound, such as gallium arsenide. The epitaxial growth substrates and the support substrate are generally matched to have a similar or substantially similar coefficient of thermal expansion (CTE) in order to reduce or prevent stress within the epitaxial growth substrates, as well as the ELO films deposited on the epitaxial growth substrates. Gallium arsenide, such as a gallium arsenide growth substrate, usually has a CTE within a range from about $5.73 \times 10^{-6}$ $C.^{-1}$ to about $6.86 \times 10^{-6}$ $C.^{-1}$. Therefore, in one embodiment, a tiled growth substrate, such as a gallium arsenide tiled growth substrate, is provided which includes a support substrate and two or more gallium arsenide growth substrates disposed over the support substrate, next to each other, and detached from each other. The CTE of the support substrate may be about $9 \times 10^{-6}$ $C.^{-1}$ or less, such as within a range from about $5 \times 10^{-6}$ $C.^{-1}$ to about $9 \times 10^{-6}$ $C.^{-1}$, preferably, from about $5.2 \times 10^{-6}$ $C.^{-1}$ to about $8.5 \times 10^{-6}$ $C.^{-1}$, and more preferably, from about $5.26 \times 10^{-6}$ $C.^{-1}$ to about $8.46 \times 10^{-6}$ $C.^{-1}$.

In another embodiment, the tiled growth substrate is provided which includes two or more gallium arsenide substrates are separately disposed over a support substrate, wherein the support substrate has a CTE for providing a maximum strain of about 0.1% or less within the gallium arsenide substrates at a temperature of about 650° C. or less.

In order to achieve the same, similar, or substantially similar coefficients of thermal expansion (CTEs) between the epitaxial growth substrates and the support substrate, the types of material in which the support substrate is chosen, in part, to match or substantially match the CTE of the material contain within the epitaxial growth substrates. Therefore, in many examples described herein, the epitaxial growth substrates are wafers, layers, thin films, or surfaces which contain epitaxial grown gallium arsenide, gallium arsenide alloys, or derivatives thereof and the support substrate contains or is made from at least one metal or metallic material, ceramic material, or combinations thereof.

In some examples, the support substrate may contain niobium, niobium alloys, titanium carbide, magnesium silicate, steatite, tungsten carbide, tungsten carbide cermet, iridium, alumina, alumina ceramics, zirconium, zirconium alloys, zirconia, zirconium carbide, osmium, tantalum, hafnium, molybdenum, molybdenum alloys, chromium, oxides thereof, silicates thereof, alloys thereof, derivatives thereof, or combinations thereof. In some examples, the support substrate has no porosity or substantially no porosity. In other examples, the support substrate may be resistant to hydrogen fluoride and hydrofluoric acid.

In some embodiments, the tiled growth substrate may have gaps extending between and separating the gallium arsenide substrates from each other. In another embodiment, the tiled growth substrate may have an adhesion layer disposed on the support substrate, and two or more gallium arsenide substrates disposed on the adhesion layer, next to each other, and detached from each other. In another embodiment, the tiled growth substrate may have the gaps between the gallium arsenide substrates and the adhesion layer disposed between the support substrate and the gallium arsenide substrates. The support substrate contains at least 2 epitaxial growth substrates, such as gallium arsenide substrates, but usually contains 3, 4, 5, 6, 9, 12, 16, 20, 24, 50, 100, or more epitaxial growth substrates or gallium arsenide substrates.

In other embodiments, the adhesion layer contains a pressure sensitive adhesive (PSA), an optical adhesive, or an ultraviolet-curable adhesive. In some examples, the adhesion layer may contain a mercapto ester compound and may further contain butyl octyl phthalate, tetrahydrofurfuryl methacrylate, acrylate monomer, derivatives thereof, or combinations thereof. In other examples, the adhesion layer contains silicone or sodium silicate.

In another embodiment, a method for forming multiple epitaxial thin films during an ELO process is provided which includes depositing a plurality of aluminum arsenide sacrificial layers simultaneously on a plurality of gallium arsenide growth surfaces disposed on a support substrate, wherein a single aluminum arsenide sacrificial layer is deposited on each gallium arsenide growth surface, and each of the gallium arsenide growth surfaces is separately disposed on the support substrate, next to each other, and a gap extends between and separates the gallium arsenide growth surfaces from each other. The method further includes depositing a plurality of buffer layers simultaneously on the plurality of aluminum arsenide sacrificial layers, wherein a single buffer layer is deposited on each aluminum arsenide sacrificial layer, depositing a plurality of gallium arsenide active layers simultaneously on the plurality of buffer layers, wherein a single gallium arsenide active layer is deposited on each buffer layer, and etching the aluminum arsenide sacrificial layers while separating the gallium arsenide active layers from the gallium arsenide growth surfaces.

In another embodiment, a method for forming a tiled growth substrate is provided which includes forming a plurality of epitaxial growth substrates during ELO processes and adhering the plurality of epitaxial growth substrates on a support substrate. The method further includes depositing a sacrificial layer over each epitaxial growth substrate disposed on the support substrate, depositing epitaxial materials over each of the sacrificial layers, and etching the sacrificial layers while removing the epitaxial materials from the epitaxial growth substrates during an additional ELO process. In other examples, the method provides exposing the tiled growth substrate, that is, the epitaxial growth substrate disposed on the support substrate, to additional deposition and ELO processes in order to form a variety of ELO films and materials.

In some examples, a method for forming a tiled growth substrate is provided which includes forming a first sacrificial layer on a host substrate, forming a first epitaxial layer over the first sacrificial layer, etching the first sacrificial layer while removing the first epitaxial layer from the host substrate and forming a first epitaxial growth substrate during a first ELO process, forming a second sacrificial layer on the host substrate, forming a second epitaxial layer over the second sacrificial layer, etching the second sacrificial layer while removing the second epitaxial layer from the host substrate and forming a second epitaxial growth substrate during a second ELO process, and adhering the first and second epitaxial growth substrates on a support substrate.

In various examples, the epitaxial material formed during ELO processes descried herein may contain gallium arsenide, aluminum gallium arsenide, indium gallium phosphide, alloys thereof, derivatives thereof, or combinations thereof. The epitaxial material may contain multiple layers. In one example, the epitaxial material has a layer containing gallium arsenide and another layer containing aluminum gallium arsenide. In one specific example, the epitaxial material may have a cell structure of multiple layers. The layers of the cell structure may contain gallium arsenide, n-doped gallium arsenide, p-doped gallium arsenide, aluminum gallium arsenide, n-doped aluminum gallium arsenide, p-doped aluminum gallium arsenide, indium gallium phosphide, alloys thereof, derivatives thereof, and combinations thereof.

In some examples, the epitaxial material contains a gallium arsenide buffer layer, an aluminum gallium arsenide passivation layer, and a gallium arsenide active layer. In some examples, the epitaxial material further has a second aluminum gallium arsenide passivation layer. The gallium arsenide buffer layer may have a thickness within a range from about 100 nm to about 500 nm, the aluminum gallium arsenide passivation layers may each have a thickness within a range from about 10 nm to about 50 nm, and the gallium arsenide active layer may have a thickness within a range from about 500 nm to about 2,000 nm. In other examples, the gallium arsenide buffer layer may have a thickness of about 300 nm, each of the aluminum gallium arsenide passivation layers may have a thickness of about 30 nm, and the gallium arsenide active layer may have a thickness of about 1,000 nm.

The sacrificial layer may contain aluminum arsenide, alloys thereof, derivatives thereof, or combinations thereof. The sacrificial layer may contain an aluminum arsenide layer, which may have a thickness of about 20 nm or less, such as within a range from about 1 nm to about 10 nm, preferably, from about 4 nm to about 6 nm. In some embodiments, the sacrificial layers or material may be exposed to a wet etch solution during an ELO etch step. The wet etch solution may contain hydrofluoric acid, and further contain a surfactant and/or a buffer.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1A:
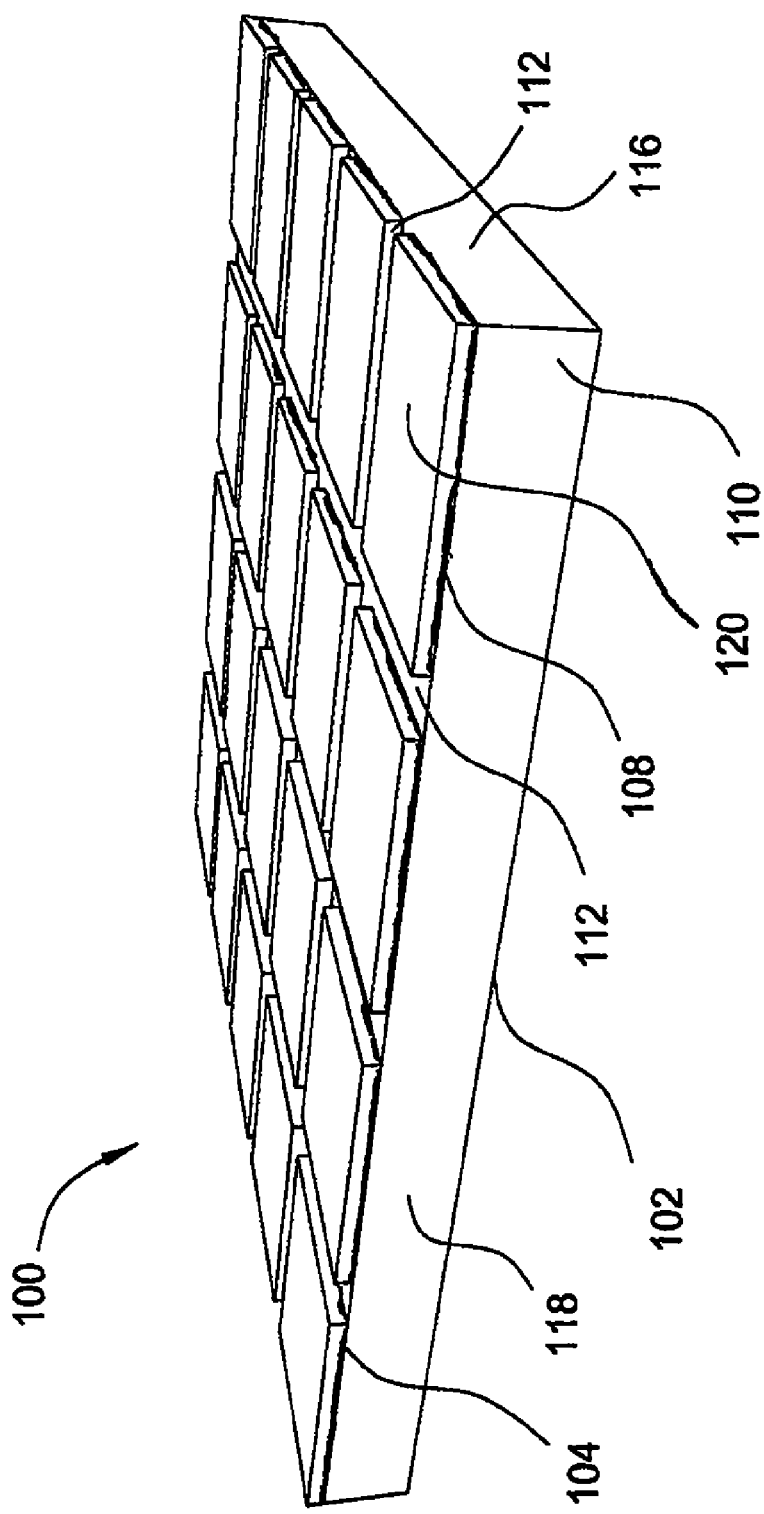
FIGS. 1A-1D depict a tiled growth substrate according to embodiments described herein.

Embodiments of the invention generally relate to epitaxial lift off (ELO) films and methods for producing such films. Embodiments provide a method to simultaneously and separately grow a plurality of ELO films or stacks on a common support substrate which is tiled with numerous epitaxial growth substrates (e.g., epitaxial or crystalline substrates, wafers, or surfaces). Thereafter, the ELO films are removed from the epitaxial growth substrates by an etching step during an ELO process. The overall throughput is quite high since multiple ELO films may be manufactured while exposing each tiled growth substrate to the numerous fabrication processes, similar to a bulk process. However, multiple tiled growth substrates, each containing a plurality of epitaxial growth substrates disposed on a support substrate, may be exposed consecutively or simultaneously to the fabrication processes. The tiled growth substrate containing the epitaxial growth substrates disposed on the support substrate may be reused to grow further ELO films.

FIGS. 1A-1D depict tiled growth substrate 100 containing a plurality of epitaxial growth substrates 120 disposed on support substrate 110, as described in one embodiment herein. In one embodiment, epitaxial growth substrates 120 are epitaxial surfaces on support substrate 110. The epitaxial surfaces may be a substrate, wafer, thin film, layer, or other material which is crystalline and is formed, deposited, grown, or otherwise attached to support substrate 110. FIGS. 1A-1D illustrate tiled growth substrate 100 containing twenty epitaxial growth substrates 120, whereas rows of five epitaxial growth substrates 120 extend along side 116 of support substrate 110 and rows of four epitaxial growth substrates 120 extend along side 118 of support substrate 110.

Figure 2A:
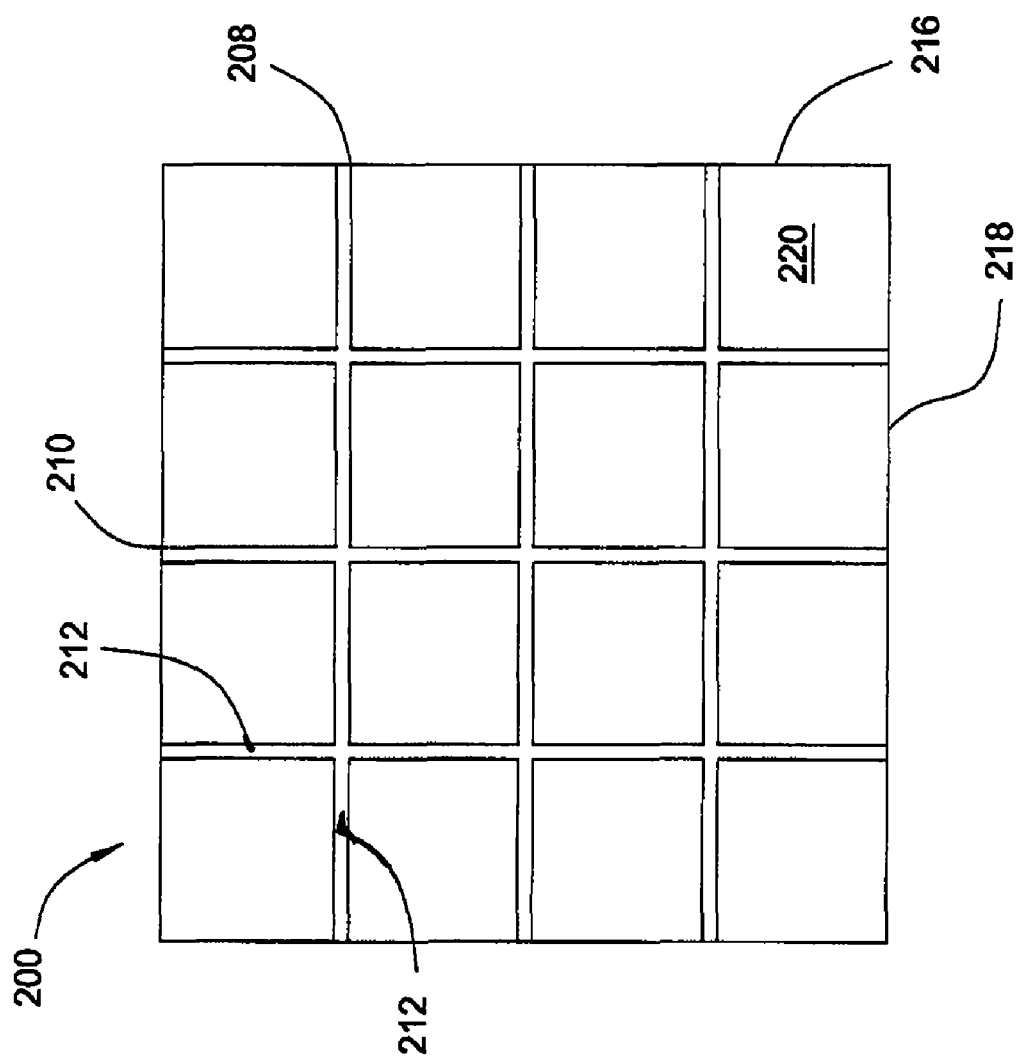
FIGS. 2A-2B depict another tiled growth substrate according to embodiments described herein.
Figure 2B:
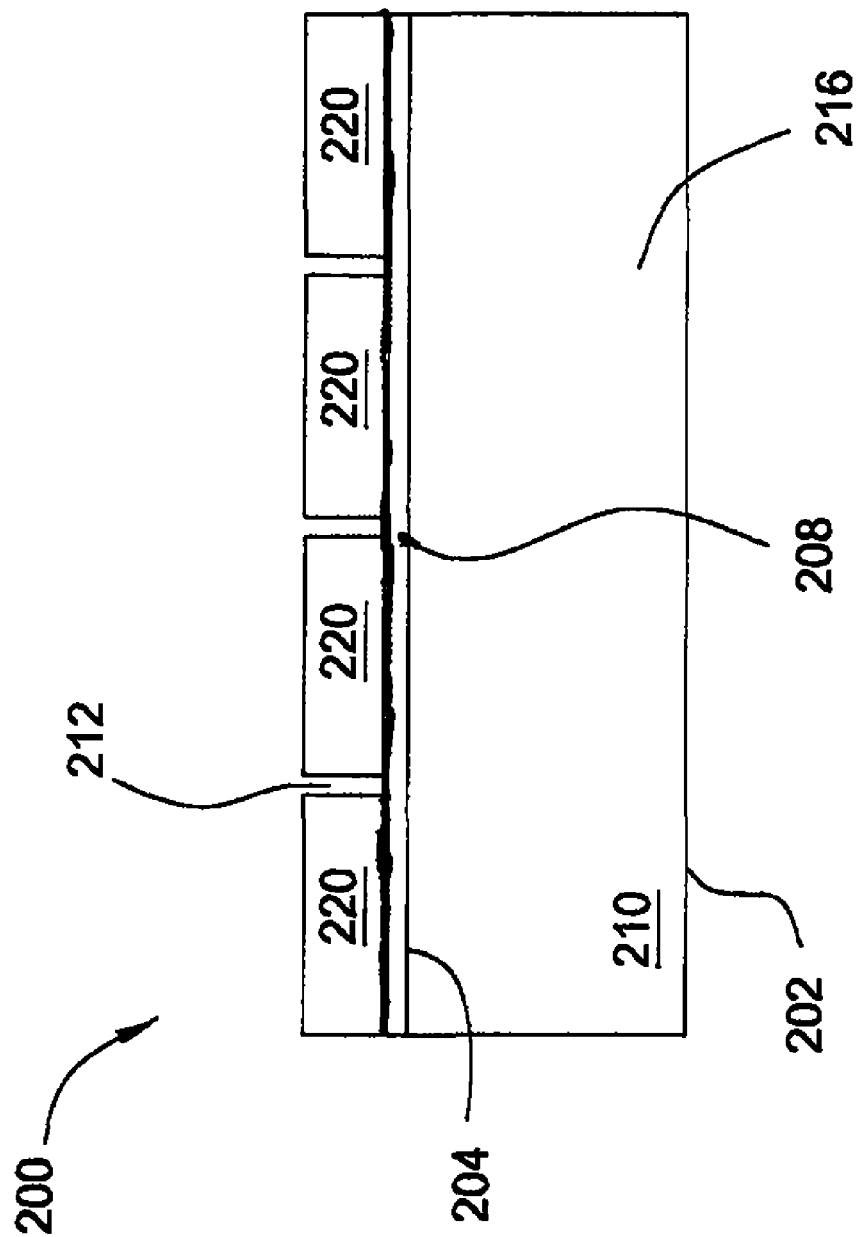

FIGS. 2A-2B depict tiled growth substrate 200 containing a plurality of epitaxial growth substrates 220 disposed on support substrate 210, as described in another embodiment herein. In another embodiment, as depicted in FIGS. 2A-2B, tiled growth substrate 200 may contain sixteen epitaxial growth substrates 220, whereas rows of four epitaxial growth substrates 220 extend along side 216 of support substrate 210 and rows of four epitaxial growth substrates 220 extend along side 218 of support substrate 210. In other embodiments, tiled growth substrates 100 and 200 may contain different amounts and placement configurations of epitaxial growth substrates 120 or 220. Tiled growth substrates 100 and 200 each has two or more epitaxial growth substrates 120 or 220, such as, for examples, 3, 4, 5, 6, 9, 12, 16, 20, 24, 50, 100, or more epitaxial growth substrates 120 or 220. In some embodiments, tiled growth substrates 100 and 200 each may have any integer within a range from 2 to 100, or more epitaxial growth substrates 120 or 220.

Support substrate 110 has lower surface 102 and upper surface 104 and support substrate 210 has lower surface 202 and upper surface 204. In one embodiment, adhesion layer 108 is disposed on upper surface 104 of support substrate 110, and epitaxial growth substrates 120 are disposed on adhesion layer 108 and adhesion layer 208 is disposed on upper surface 204 of support substrate 210, and epitaxial growth substrates 220 are disposed on adhesion layer 208.

Figure 1B:
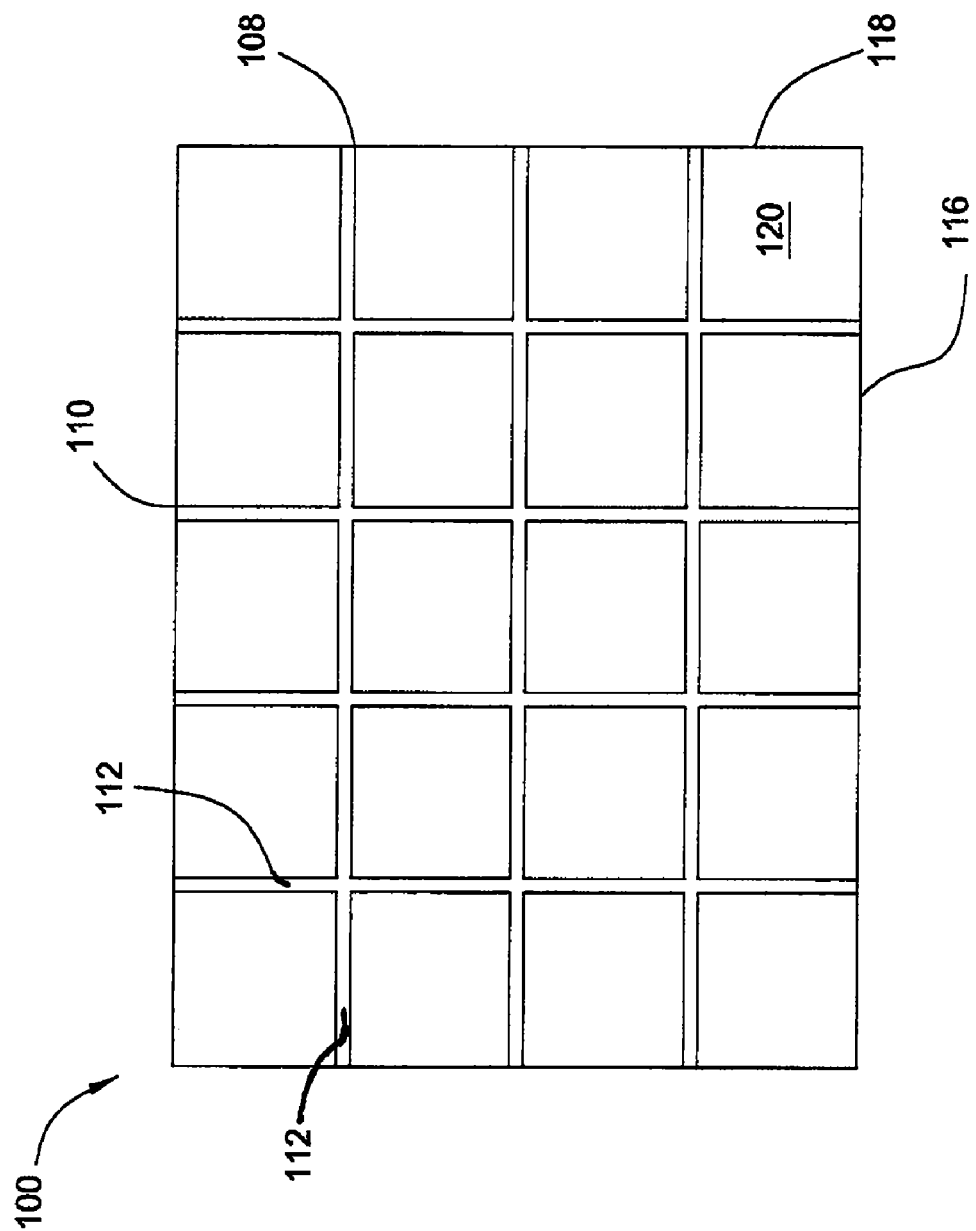
Figure 1C:
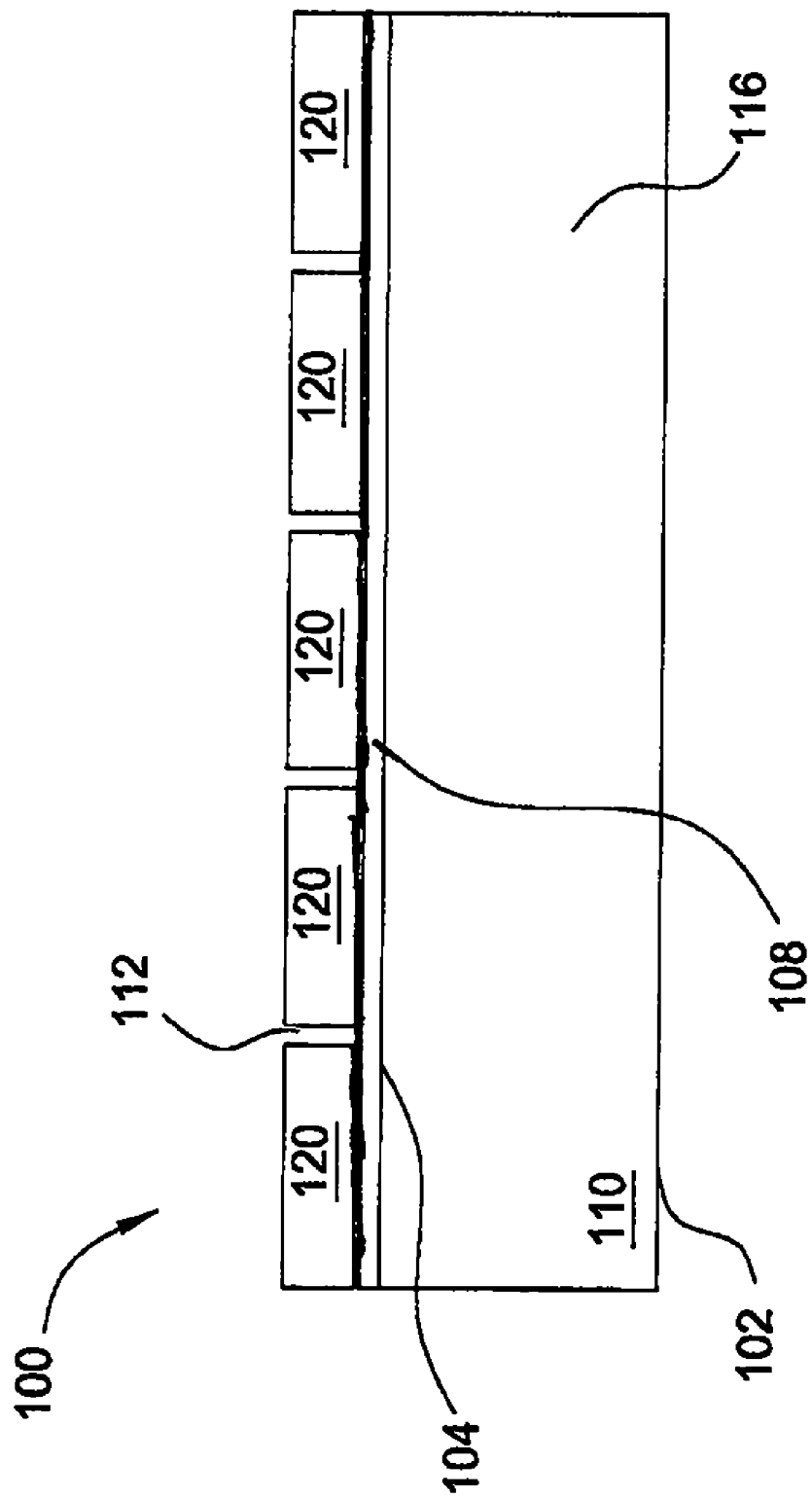
Figure 1D:
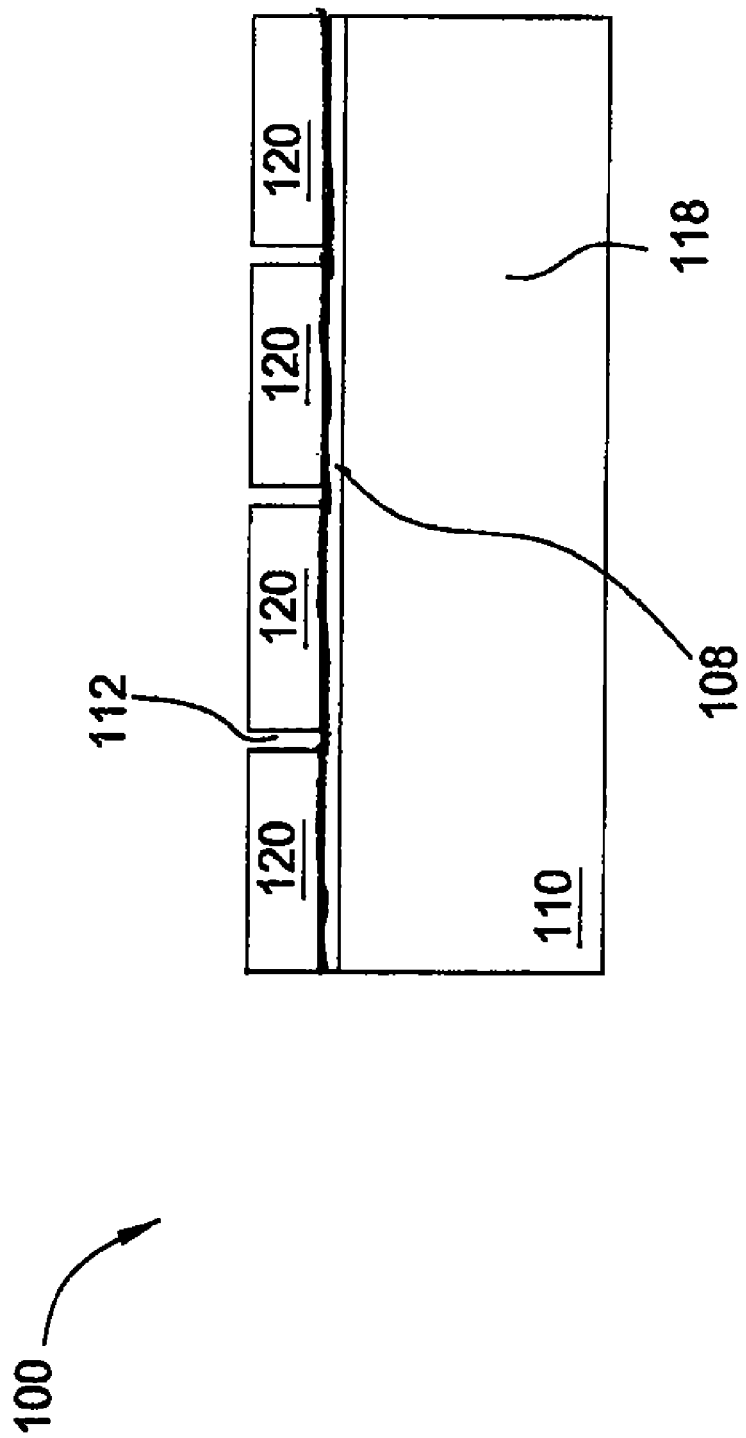

Adhesion layers 108 as depicted in FIGS. 1A-1B and adhesion layers 208 as depicted in FIG. 2A may be discontinuous layers extending across upper surfaces 104 or 204, such that adhesion layer 108 is disposed between epitaxial growth substrates 120 and upper surface 104 and not extending outside of the area below epitaxial growth substrates 120 or adhesion layer 208 is disposed between epitaxial growth substrates 220 and upper surface 204 and not extending outside of the area below epitaxial growth substrates 220. Alternatively, adhesion layer 108 depicted in FIGS. 1C-1D as well as adhesion layer 208 depicted in FIG. 2B are shown as continuous layers extending across upper surfaces 104 or 204.

In one embodiment, while forming tiled growth substrate 100, adhesion layer 108 is discontinuously disposed on upper surface 104 of support substrate 110, and epitaxial growth substrates 120 are disposed on adhesion layer 108 such that each epitaxial growth substrate 120 completely covers each adhesion layer 108. Therefore, each adhesion layer 108 has the same or less surface area as does each epitaxial growth substrate 120 disposed thereover. Alternatively, in another embodiment to form tiled growth substrate 100, an individual adhesion layer 108 is disposed on each epitaxial growth substrate 120 so to partially or completely cover the underside of each epitaxial growth substrate 120, and thereafter, the epitaxial growth substrates 120 are positioned and attached to the support substrate 110. The same configurations as described for tiled growth substrate 100 are also for tiled growth substrate 200, such as adhesion layer 208 is disposed on upper surface 204 of support substrate 210 or adhesion layer 208 is disposed on each epitaxial growth substrate 220 prior to positioning and attaching the plurality of epitaxial growth substrates 220 on support substrate 210.

In an alternative embodiment, adhesion layers 108 or 208 are not present and epitaxial growth substrates 120 are disposed directly on upper surface 104 of support substrate 110, or epitaxial growth substrates 220 are disposed directly on upper surface 204 of support substrate 210. Epitaxial growth substrates 120 or similar growth surfaces may be deposited, grown, or formed directly on upper surface 104 of support substrate 110 by a chemical vapor deposition (CVD) process, an atomic layer deposition (ALD) process, an atomic layer epitaxy deposition (ALE) process, a physical vapor deposition (PVD) or sputtering process, an electroless deposition process. The CVD, ALD, and ALE processes include thermal, plasma, pulsed, and metal-organic deposition techniques.

The adhesion layer may be a single layer or contain multiple layers. The adhesion layer may contain an adhesive or a glue and may be a polymer, a copolymer, an oligomer, derivatives thereof, or combinations thereof. In some embodiments, a single adhesion layer or a plurality of adhesion layers may be disposed on the support substrate and thereafter, epitaxial growth substrates are adhered to the adhesion layer or each of the adhesion layers. Alternatively, an adhesion layer may be disposed on each of the epitaxial growth substrates and thereafter, the epitaxial growth substrates are adhered to the support substrate.

In one embodiment, the adhesion layer contains a copolymer. In one example, the copolymer may be an ethylene/ vinylacetate (EVA) copolymer or derivatives thereof. An EVA copolymer which is useful as the adhesion layer is a WAFER GRIP adhesive film, commercially available from Dynatex International, located in Santa Rosa, Calif. In other examples, the adhesion layer may contain a hot-melt adhesive, an organic material or organic coating, an inorganic material, or combinations thereof. In some embodiments, the adhesion layer may have a thickness within a range from about 5 µm to about 100 µm.

In another embodiment, the adhesion layer may contain an elastomer, such as rubber, foam, or derivatives thereof. Alternatively, the adhesion layer may contain a material such as neoprene, latex, or derivatives thereof. The adhesion layer may contain a monomer. For example, the adhesion layer may contain an ethylene propylene diene monomer or derivatives thereof.

In other embodiments, the adhesion layer may contain or be attached by a pressure sensitive adhesive (PSA), an acrylic PSA, or other adhesive laminate. In one example, the PSA may be a 100 HT (high temperature) acrylic PSA or a 100 HTL (high temperature liner) acrylic PSA. In some examples, the adhesion layer may be a PSA which is a laminate containing polyvinyl, polycarbonate, polyester, derivatives thereof, or combinations thereof. In some examples, the adhesion layer may contain a PSA laminate which has a thickness within a range from about 50 µm to about 250 µm. Many PSA laminates which may be used for the adhesion layer are commercially available, such as acrylic PSA adhesive laminates (100 series) from 3M Inc., located in St. Paul, Minn.

In another embodiment, the adhesion layer may contain an optical adhesive or an UV-curable adhesive when bonding or adhering epitaxial growth substrates to the support substrate. Examples provide that the optical or UV-curable adhesive contains butyl octyl phthalate, tetrahydrofurfuryl methacrylate, acrylate monomer, derivatives thereof, or combinations thereof. The curable adhesive may be applied to the epitaxial growth substrates, to the support substrate, or both. In some embodiments, a UV-light source may be shined through epitaxial growth substrates in order to cure the adhesive and form the adhesion layer. Generally, the adhesive may be exposed to the UV radiation for a time period within a range from about 1 minute to about 10 minutes, preferably, from about 3 minutes to about 7 minutes, such as about 5 minutes. The adhesive may be cured at a temperature within a range from about 25° C. to about 75° C., such as about 50° C. The adhesion layer may be formed from or contain an optical adhesive and/or a UV-curable, such as commercially available as Norland UV-curable optical adhesive.

In some examples, adhesion layers 108, 208, and 308 may contain an optical adhesive or an ultraviolet-curable adhesive. Adhesion layers 108, 208, and 308 may contain a mercapto ester compound and may further contain butyl octyl phthalate, tetrahydrofurfuryl methacrylate, acrylate monomer, derivatives thereof, or combinations thereof. In other examples, adhesion layers 108 and 208 may contain silicone or sodium silicate.

Regions, areas, spaces or spacings, such as gaps 112, extend between epitaxial growth substrates 120 to separate each epitaxial growth substrate 120 from each other on tiled growth substrate 100. Gaps 112 may reveal upper surface 104 of support substrate 110, the upper surface of adhesion layer 108, or the surface of other materials, such as a stop layer, protective layer, or other layer. Similarly for epitaxial growth substrates 220, regions, areas, spaces or spacings, such as gaps 212 extend between epitaxial growth substrates 220 to separate each epitaxial growth substrate 220 from each other. Gaps 212 may reveal upper surface 204 of support substrate 210, the upper surface of adhesion layer 208, or the surface of other materials, such as a stop layer, protective layer, or other layer. Most examples provide that upper surface 104 of support substrate 110 is exposed within gaps 112 or upper surface 204 of support substrate 210 is exposed within gaps 212.

In an alternative embodiment, not shown, tiled growth substrate 100 or 200 may contain a plurality of epitaxial growth substrates 120 or 220 disposed on support substrate 110 or 220 wherein the epitaxial growth substrates 120 or 220 are not separated from each other. In some examples, tiled growth substrate 100 or 200 is a gallium arsenide substrate assembly containing a plurality of epitaxial growth substrates 120 or 220 which contain gallium arsenide or derivatives thereof.

Tiled growth substrate 100, 200, or 300 is a gallium arsenide substrate assembly which has two or more gallium arsenide growth substrates (e.g., epitaxial growth substrates 120, 220, or 320) disposed over the support substrates 110, 210, or 310. In many embodiments described herein, the epitaxial growth substrates 120, 220, or 320 are gallium arsenide growth substrates.

Since gallium arsenide, such as a gallium arsenide growth substrate, usually has a coefficient of thermal expansion (CTE) within a range from about $5.73 \times 10^{-6}$ °C.$^{-1}$ to about $6.86 \times 10^{-6}$ °C.$^{-1}$, the support substrate is formed from or contains materials having a similar or substantially similar CTE. In some embodiments described herein, the support substrate, such as support substrates 110, 210, and/or 310, may be formed from or contain a material having a CTE of about $9 \times 10^{-6}$ °C.$^{-1}$ or less, such as within a range from about $5 \times 10^{-6}$ °C.$^{-1}$ to about $9 \times 10^{-6}$ °C.$^{-1}$, preferably, from about $5.2 \times 10^{-6}$ °C.$^{-1}$ to about $8.5 \times 10^{-6}$ °C.$^{-1}$, and more preferably, from about $5.26 \times 10^{-6}$ °C.$^{-1}$ to about $8.46 \times 10^{-6}$ °C.$^{-1}$.

In many embodiments, the support substrate forms a maximum strain of about 0.1% or less within the epitaxial growth substrates, such as the gallium arsenide growth substrates while at a temperature within a range from about 20° C. to about 650° C. In some examples, the support substrates (e.g., support substrates 110, 210, and/or 310) may have a CTE for providing a maximum strain of about 0.1% or less within the epitaxial growth substrates 120, 220, or 320 at a temperature of about 650° C., about 630° C., or less. In some examples, gaps 112 extend between and separate the epitaxial growth substrates 120 from each other, as gaps 212 extend between and separate the epitaxial growth substrates 220 from each other and gaps 312 extend between and separate the epitaxial growth substrates 320 from each other.

In order to achieve the same, similar, or substantially similar coefficients of thermal expansion (CTEs) between the epitaxial growth substrates and the support substrate, the types of material in which the support substrate is chosen, in part, to match or substantially match the CTE of the material contain within the epitaxial growth substrates. Therefore, in many examples described herein, the epitaxial growth substrates are wafers, layers, thin films, or surfaces which contain epitaxial grown gallium arsenide, crystalline gallium arsenide, gallium arsenide alloys, or derivatives thereof.

The support substrates are utilized in tiled growth substrates and may contain or be formed from a metallic material, a ceramic material, a plastic material, or combinations thereof. The support substrates generally contain or are made from at least one metal or metallic material, ceramic material, or combinations thereof. In some examples, the support substrates may be nonporous or substantially nonporous. In other examples, the support substrates may be resistant to hydrogen fluoride and hydrofluoric acid.

In some embodiments, the support substrates may contain niobium, niobium alloys, titanium carbide, magnesium silicate, steatite, tungsten carbide, tungsten carbide cermet, iridium, alumina, alumina ceramics, zirconium, zirconium alloys, zirconia, zirconium carbide, osmium, tantalum, hafnium, molybdenum, molybdenum alloys, oxides thereof, silicates thereof, alloys thereof, derivatives thereof, or combinations thereof.

In some embodiments, the support substrate may contain or be formed from at least one metallic material. The support substrate may contain a single layer of the metallic material or multiple layers of the same metallic material or different metallic materials. In some examples, the metallic material of the support substrate contains at least one metal such as titanium, zirconium, hafnium, niobium, tantalum, chromium, molybdenum, tungsten, manganese, rhenium, iron, ruthenium, cobalt, rhodium, nickel, palladium, platinum, copper, silver, gold, zinc, aluminum, alloys thereof, or combinations thereof. The metallic material may also contain silicon, carbon, and/or boron, at various concentrations of an alloy, and/or may contain other elements in trace amounts.

In some embodiments, the support substrate may contain or be formed from at least one metallic material containing molybdenum or molybdenum alloy. The molybdenum-containing metallic material may contain annealed molybdenum, stress relieved condition molybdenum, recrystallized molybdenum, annealed niobium, cold-worked niobium, wrought niobium, annealed rhenium, deformed rhenium, annealed tantalum, cold-worked tantalum, molybdenum disilicide (MoSi$_2$), molybdenum titanium carbon alloy (MoTiC alloy), molybdenum-titanium alloy (95.5Mo-0.5Ti), molybdenum-titanium-carbon alloy (Mo-0.5Ti-0.02C, molybdenum alloy 362), molybdenum-titanium-zirconium alloy (MoTiZr alloy), molybdenum TZC (Mo-1Ti-0.3Zr), arc cast molybdenum TZM (Mo-0.5Ti-0.1Zr; Mo-alloy 363) (stress relieved and recrystallized), P/M molybdenum TZM (Mo-0.5Ti-0.1Zr; Mo-alloy 364) (stress relieved and recrystallized), molybdenum rhenium alloy (Mo-44.5Re—annealed); molybdenum rhenium alloy (Mo-47.5Re—annealed and deformed), Mo—Cu composites (Ametek molybdenum-copper composites AMC 7525, 8020, or 8515), derivatives thereof, alloys thereof, or combinations thereof. In some examples, the support substrate may contain or be formed from molybdenum-copper containing by weight about 75% molybdenum and about 25% copper, or about 80% molybdenum and about 20% copper, or about 85% molybdenum and about 15% copper.

In some embodiments, the support substrate may contain or be formed from at least one metallic material containing tungsten or tungsten alloy. The tungsten-containing metallic material may contain high density machinable tungsten (CMW® 1000 AMS-T-21014 AMS-7725 ASTM B777), tungsten alloys (CMW® 3000 alloy—AMS-T-21014 AMS-7725 and CMW® 3950—alloy AMS-T-21014 ASTM B777), and W—Cu composites (Ametek tungsten-copper composites AWC 8515, 8812, or 9010), derivatives thereof, alloys thereof, or combinations thereof. In some examples, the support substrate may contain or be formed from tungsten-copper composites containing by weight about 85% tungsten and about 15% copper, or about 88% tungsten and about 12% copper, or about 90% tungsten and about 10% copper.

In other embodiments, the support substrate may contain or be formed from at least one metallic material containing niobium or niobium alloy. The niobium-containing metallic material may contain niobium alloy C-103 (89Nb-10Hf-1Ti) (cold-rolled, stress relieved, and recrystallized), niobium alloy C-129Y (80Nb-10W-10Hf-0.1Y), niobium alloy Cb-752 (Nb-10W-2.5Zr), derivatives thereof, alloys thereof, or combinations thereof.

In other embodiments, the support substrate may contain or be formed from at least one metallic material containing titanium or titanium alloy and/or zirconium or zirconium alloy. The metallic material containing titanium or zirconium may contain titanium alloy Ti-6Al-2Sn-4Zr-2Mo-0.1Si (duplex annealed), titanium Ti-6Al-2Sn-4Zr-2Mo (Ti-6-2-4-2) (duplex annealed and sheet), zirconium (grade 702—commercially pure), zirconium (reactor grade), derivatives thereof, alloys thereof, or combinations thereof.

In other embodiments, the support substrate may contain or be formed from at least one controlled expansion (CE) alloy, such as an aluminum-silicon alloy. In one example, the aluminum-silicon alloy contains by weight about 30% aluminum and about 70% silicon, such as the CE7 Al—Si controlled expansion alloy, available from Osprey Metals.

In other embodiments, the support substrate may contain or be formed from at least one metallic material containing iron or iron alloy. The iron-containing metallic material may contain an iron-nickel alloy, an iron-nickel-manganese alloy (Fe-36Ni-0.35Mn-0.20Si-0.02C) Carpenter Invar 36® alloy (cold drawn bars, cold rolled strips, and annealed bars & strips), an iron-nickel-cobalt alloy, Carpenter Kovar® alloy (glass and ceramic sealing alloy), iron-nickel-cobalt-titanium alloy, iron-nickel-cobalt-titanium-niobium alloy, iron-nickel-cobalt-titanium-tantalum alloy, iron-nickel-cobalt-titanium-niobium-tantalum alloy Carpenter Pyromet® CTX-3 Superalloy (heat treated and heat treatment for brazing cycles over 982° C.), an iron-nickel-cobalt-niobium-titanium-aluminum alloy, INCOLOY® alloy 903, an iron-nickel-cobalt-niobium-titanium alloy, INCOLOY® alloy 907, an iron-nickel-cobalt-niobium-titanium alloy, INCOLOY® alloy 909, Fe—Ni alloys, Fe—Ni—Mn alloys (Allegheny Ludlum AL 42™ electrical alloy), UNS K94100, derivatives thereof, alloys thereof, or combinations thereof.

In one example, the support substrate may contain or be formed from an iron-nickel-manganese alloy which contains by weight about 58.4% of Fe, about 40.8% of Ni, and about 0.5% of Mn, is the AL 42™ electrical alloy, available from Allegheny Ludlum Corporation, USA.

In another example, the support substrate may contain or be formed from an iron-nickel-manganese alloy which contains by weight about 63.4% of Fe, about 36% of Ni, about 0.35% of Mn, about 0.20% of Si, and about 0.02% of C, is Carpenter Invar 36® alloy, available as cold drawn bars, cold rolled strips, and annealed bars and strips.

In another example, the support substrate may contain or be formed from an iron-nickel-cobalt alloy which contains by weight about 53.4% of Fe, about 29% of Ni, about 17% of Co, about 0.30% of Mn, about 0.20% of Si, and about 0.02% of C, is Carpenter Kovar® Fe—Ni—Co alloy.

In another example, the support substrate may contain or be formed from an iron-nickel-cobalt-titanium alloy may contain niobium, tantalum, or both niobium and tantalum. The iron-nickel-cobalt-titanium alloy contains by weight about 37%-39% of Ni, about 13%-15% of Co, about 1.25%-1.75% of Ti, and about 4.50%-5.50% of Nb and Ta mixture, and about 36.3%-41.8% or balance of Fe, is Carpenter Pyromet® CTX-3 superalloy.

In another example, the support substrate may contain or be formed from an iron-nickel-cobalt-niobium-titanium-aluminum alloy which contains by weight about 36%-40% of Ni, about 13%-17% of Co, about 0.30%-1.15% of Al, about 1.00%-1.85% of Ti, about 2.40%-3.50% of Nb, and about 36.5%-47.3% or balance of Fe, is INCOLOY® alloy 903.

In another example, the support substrate may contain or be formed from an iron-nickel-cobalt-niobium-titanium alloy which contains by weight about 35%-40% of Ni, about 12%-16% of Co, about 4.30%-5.20% of Nb, about 1.3%-1.8% of Ti, about 0.02%-0.20% of Al, about 0.07%-0.35% of Si, and about 36.5%-47.3% or balance of Fe, is INCOLOY® alloy 907.

In another example, the support substrate may contain or be formed from an iron-nickel-cobalt-niobium-titanium alloy which contains by weight about 35%-40% of Ni, about 12%-16% of Co, about 4.30%-5.20% of Nb, about 1.3%-1.8% of Ti, about 0.001%-0.15% of Al, about 0.25%-0.50% of Si, about 0.001%-0.06% of C, and about 36.3%-47.1% or balance of Fe, is INCOLOY® alloy 909.

In some embodiments, the support substrate may contain or be formed from at least one ceramic material. The support substrate may contain a single layer of the ceramic material or multiple layers of the same ceramic material or different ceramic materials. The ceramic material of the support substrate contains at least one material such as aluminum oxide, alumina, silicon oxide, silica, zirconium oxide, zirconia, hafnium oxide, hafnia, magnesium oxide, magnesium silicon oxide (steatite), magnesium scandium sulfide, cerium boride, calcium boride, iron aluminum oxide, ferro aluminum oxide, graphite, oxides thereof, borides thereof, derivatives thereof, or combinations thereof.

In some specific examples, the support substrate may contain or be formed from at least one ceramic material selected from 96% alumina, thick-film (as fired), 92% alumina (opaque), 85% alumina (vitreous body), 95% alumina (vitreous body), 99.5% alumina (vitreous body), alumina (96% $Al_2O_3$), 99.5% alumina (thin film substrate), 99.6% alumina (thin-film substrate), beryllia (99.5% BeO), calcium boride, cerium boride ($CeB_6$), albite (Feldspar $NaAlSi_3O_8$), calcite ($CaCO_3$), steatite (magnesium silicon oxide), magnesium scandium sulfide ($MgSc_2S_4$), zinc gallium sulfide ($ZnGa_2S_4$), CoorsTek alumina AD-85 (nom. 85% $Al_2O_3$), CoorsTek alumina AD-90 (nom. 90% $Al_2O_3$), CoorsTek alumina AD-94 (nom. 94% $Al_2O_3$), CoorsTek alumina AD-96 (nom. 96% $Al_2O_3$), CoorsTek alumina FG-995 (nom. 98.5% $Al_2O_3$), CoorsTek alumina AD-995 (nom. 99.5% $Al_2O_3$), CoorsTek alumina AD-998 (nom. 99.8% $Al_2O_3$), Advanced Ceramics ALC 1081 (C-786) alumina, Advanced Ceramics ALC 1082 (C-786) alumina, Advanced Ceramics ACL 1085 (C-795) alumina, CeramTec 665 steatite (MgO—$SiO_2$), CeramTec 771 94% alumina ($Al_2O_3$), CeramTec Grade 614 White 96% alumina ($Al_2O_3$), CeramTec Grade 698 Pink 96% alumina ($Al_2O_3$), CeramTec 975 99.5% alumina ($Al_2O_3$), CeramTec 433 99.9% alumina ($Al_2O_3$), CeramTec 950 toughened alumina ($Al_2O_3$—$ZrO_2$), CeramTec 848 zirconia ($ZrO_2$), Corning 7056 alkali borosilicate crushed/powdered glass, Du—Co ceramics DC-9-L-3 steatite, Du—Co Ceramics DC-10-L-3 steatite, Du—Co ceramics DC-16-L-3 steatite, Du—Co Ceramics CS-144-L-5 steatite, Du—Co ceramics DC-265-L-6 alumina (96% $Al_2O_3$), ferro aluminum oxide P87, P890, P3640, or P3142, ICE $Al_2O_3$ 94, 96, 99.5, or 99.8, ICE Hot Pressed SiC, ICE Mullite ($3Al_2O_3$—$SiO_2$), ICE Steatite L-4 or L-5, CoorsTek Mullite (S2), 3M Nextel™ 440, 550, 610, 650, or 720 Industrial Ceramic Fiber, Morgan Advanced Ceramics Deranox™ 970 or 975 alumina, Morgan Advanced Ceramics Sintox™ FF alumina, Saxonburg Ceramics L-3 or L-5 Steatite, alumina (Saxonburg Ceramics S-697/S-700-02 alumina), alumina (Saxonburg Ceramics S-700-22 alumina), alumina (Saxonburg Ceramics S-660 alumina), alumina (Saxonburg Ceramics S-699 alumina (crushable), CoorsTek Zirconia-Toughened alumina (ZTA), graphite (Poco Graphite Fabmate® Pore-Free Specialty Graphite and Poco Graphite Durabraze® purified/machined specialty graphite), Wieland ALLUX®/ZIROX® ceramic veneering, oxides thereof, borides thereof, derivatives thereof, or combinations thereof.

In other embodiments described herein, a method for forming a tiled growth substrate is provided which includes forming a plurality of epitaxial growth substrates, films, or materials during ELO processes, and thereafter, adhering the plurality of epitaxial growth substrates on a support substrate. Subsequently, the method provides using the tiled growth substrate to form additional ELO films or other epitaxial materials by depositing a sacrificial layer over each epitaxial growth substrate disposed on the support substrate and depositing epitaxial materials over each of the sacrificial layers. The epitaxial materials may contain a single layer, but usually contains a plurality of layers, such as a photovoltaic or solar device or portion thereof. The method further provides etching the sacrificial layers while removing the epitaxial materials from the epitaxial growth substrates during an additional ELO process.

In one example, a method for forming a tiled growth substrate is provided which includes forming a first sacrificial layer on a host substrate, forming a first epitaxial layer over the first sacrificial layer, etching the first sacrificial layer while removing the first epitaxial layer from the host substrate and forming a first epitaxial growth substrate during a first ELO process, forming a second sacrificial layer on the host substrate, forming a second epitaxial layer over the second sacrificial layer, etching the second sacrificial layer while removing the second epitaxial layer from the host substrate and forming a second epitaxial growth substrate during a second ELO process, and adhering the first and second epitaxial growth substrates on a support substrate.

In another example, a method for forming a tiled growth substrate is provided which includes forming a first epitaxial layer on a first sacrificial layer disposed on a host substrate, etching the first sacrificial layer while removing the first epitaxial layer from the host substrate to form a first epitaxial growth substrate during a first ELO process. The method further provides forming a plurality of epitaxial growth substrates during multiple deposition and ELO processes. Subsequently, the method provides adhering the plurality of epitaxial growth substrates on a support substrate to form the tiled growth substrate. In another embodiment, the method provides exposing the tiled growth substrate, that is, the epitaxial growth substrate disposed on the support substrate, to additional deposition and ELO processes in order to form a variety of ELO films and materials.

Figure 3A:
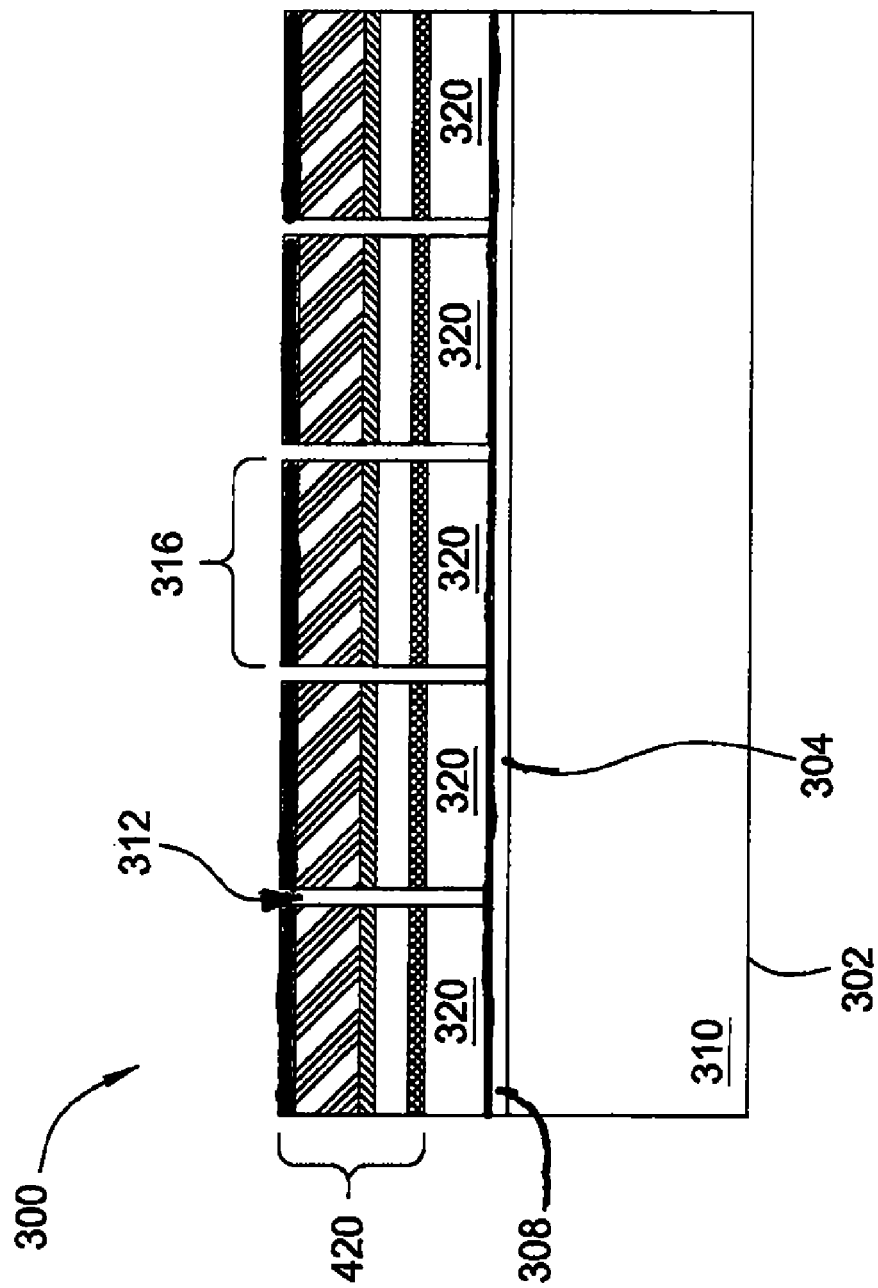
FIGS. 3A-3B depict ELO thin film stacks disposed on a tiled growth substrate according to embodiments described herein.

FIG. 3A illustrates tiled growth substrate 300 containing a plurality of epitaxial growth substrates 320 disposed on adhesion layer 308, which is further disposed on support substrate 310, as described in one embodiment herein. In other embodiments, support substrate 310 contains a plurality of epitaxial growth substrates 320 each independently disposed on a separate adhesion layer 308, such that a plurality of adhesion layers 308 extends support substrate 310. In other embodiments, a plurality of epitaxial growth substrates 320 is directly disposed on support substrate 310 without an adhesion layer.

Tiled growth substrate 300 may contain a single row or multiple rows of epitaxial growth substrates 320. A row containing five epitaxial growth substrates 320 is illustrated in FIG. 3A. In one example, tiled growth substrate 300 contains four rows, therefore has twenty epitaxial growth substrates 320. Tiled growth substrate 300 is depicted containing a plurality of epitaxial stacks 420 disposed thereon, such that there is an epitaxial stack 420 formed or deposited on each epitaxial growth substrate 320, as described by embodiments herein. A space, area, or region, such as gap 312, extends between each of the ELO film stacks 316 including each epitaxial stack 420 disposed on an independent epitaxial growth substrate 320.

Figure 3B:
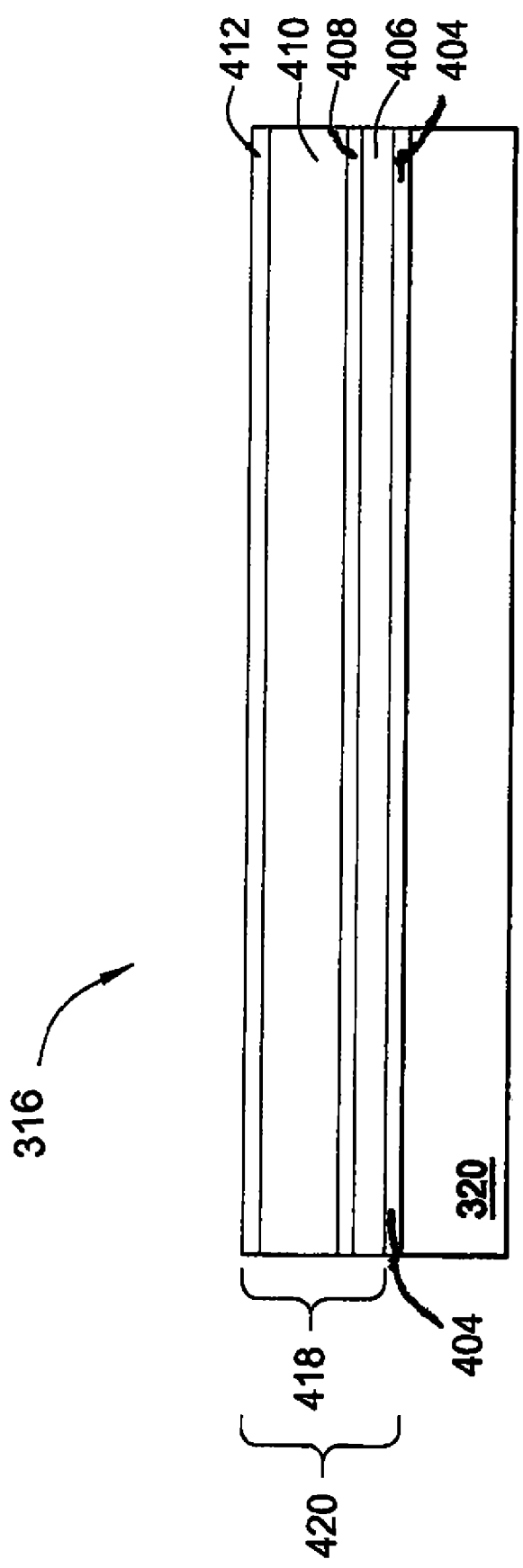

FIG. 3B depicts a single ELO film stack 316 containing epitaxial stack 420 disposed on an epitaxial growth substrate 320, according to embodiments described herein. Adhesion layer 308 and support substrate 310 were not shown in order to illustrate details of ELO film stack 316. In one embodiment, epitaxial stack 420 contains epitaxial material 418 disposed on sacrificial layer 404, which is disposed on epitaxial growth substrate 320. Epitaxial material 418 may contain at least gallium arsenide active layer 410 of gallium arsenide, but may contain a plurality of other layers, including buffer and passivation layers. As depicted in FIGS. 3A-3B, epitaxial material 418 disposed on sacrificial layer 404, and epitaxial material 418 contains buffer layer 406 disposed on sacrificial layer 404, passivation layer 408 disposed on buffer layer 406, gallium arsenide active layer 410 disposed on passivation layer 408, and passivation layer 412 disposed on gallium arsenide active layer 410, as described in embodiments herein.

While FIG. 3A depicts a single row of five epitaxial stacks 420 disposed on tiled growth substrate 300, epitaxial stacks 420 may be disposed on tiled growth substrate 300 in a variety of configurations. A single row or multiple rows of epitaxial stacks 420 may be disposed on tiled growth substrate 300. Each row of five epitaxial stacks 420 may have two or more epitaxial stacks 420. In some examples, tiled growth substrate 300 may contain two, three, four, five six, ten, twelve, twenty, twenty four, thirty, fifty, one hundred, or more epitaxial stacks 420, each contained on an epitaxial growth substrate 320. In various embodiments, the ELO process includes removing sacrificial layers 404 during an etching process, while peeling the ELO film or epitaxial material 418 from epitaxial growth substrates 320 or other layer of epitaxial material 418 and forming an etch crevice therebetween until epitaxial material 418 is removed from epitaxial growth substrate 320.

In one embodiment, thin film stacks on tiled growth substrate 300 is provided which includes a plurality of epitaxial stacks 420, each disposed on epitaxial growth substrates 320 (e.g., containing GaAs), wherein each epitaxial stack 420 contains a layer of epitaxial material 418 deposited over a layer of sacrificial material 404, as depicted in FIGS. 3A-3B.

The layers of epitaxial material 418 and/or sacrificial material 404 within each epitaxial stack 420 may have the same composition or different compositions. In some examples, each layer of the epitaxial material 418 may independently contain gallium arsenide, aluminum gallium arsenide, indium gallium phosphide, alloys thereof, derivatives thereof, or combinations thereof. Also, each layer of the epitaxial material 418 may have multiple layers. In one example, each layer of the epitaxial material 418 independently has a layer containing gallium arsenide and another layer containing aluminum gallium arsenide. In other examples, each layer of the epitaxial material 418 may independently contain buffer layer 406, passivation layer 408, and gallium arsenide active layer 410. In some examples, each layer of the epitaxial material 418 further contains a second passivation layer 412. In one example, each layer of the epitaxial material 418 may independently have buffer layer 406 containing gallium arsenide, passivation layers 408 and 412 containing aluminum gallium arsenide, and gallium arsenide active layer 410.

In some examples, the gallium arsenide buffer layer may have a thickness within a range from about 100 nm to about 400 nm, each of the passivation layers 408 and 412 may have a thickness within a range from about 10 nm to about 50 nm, and the gallium arsenide active layer 410 may have a thickness within a range from about 400 nm to about 2,000 nm. In other examples, the gallium arsenide buffer layer 406 may have a thickness of about 300 nm, each of the passivation layers 408 and 412 may have a thickness of about 30 nm, and the gallium arsenide active layer 410 may have a thickness of about 1,000 nm. Each of the passivation layers 408 and 412 may independently contain aluminum gallium arsenide alloy or a derivative thereof.

In other examples, each layer of the gallium arsenide active layer 410 or the epitaxial material 418 may have a photovoltaic cell structure containing multiple layers. In one example, the photovoltaic cell structure may contain gallium arsenide, n-doped gallium arsenide, p-doped gallium arsenide, aluminum gallium arsenide, n-doped aluminum gallium arsenide, p-doped aluminum gallium arsenide, indium gallium phosphide, alloys thereof, derivatives thereof, or combinations thereof.

In another embodiment, each layer of the sacrificial material 404 may independently contain a material such as aluminum arsenide, alloys thereof, derivatives thereof, or combinations thereof. In some examples, each layer of the sacrificial material 404 may independently contain an aluminum arsenide layer having a thickness of about 20 nm or less, such as within a range from about 1 nm to about 10 nm, preferably, from about 4 nm to about 6 nm.

Epitaxial growth substrates 320 may contain or be formed of a variety of materials, such as Group III/IV materials, and may be doped with other elements. In one embodiment, epitaxial growth substrates 320 contain gallium arsenide, gallium arsenide alloys, or derivatives thereof. In some example, epitaxial growth substrates 320 may contain n-doped gallium arsenide or p-doped gallium arsenide. Gallium arsenide, such as a gallium arsenide growth substrate, may have a CTE within a range from about $5.73 \times 10^{-6}$ °C.$^{-1}$ to about $6.86 \times 10^{-6}$ °C.$^{-1}$.

In another embodiment, a method for forming various epitaxial materials on tiled growth substrate 300 is provided which includes depositing a plurality of epitaxial stacks 420 on epitaxial growth substrates 320, wherein each ELO stack 316 contains epitaxial stack 420 containing a layer of epitaxial material 418 and each epitaxial stack 420 is deposited over a layer of sacrificial material 404.

In another embodiment, a method for forming various epitaxial materials on tiled growth substrate 300 is provided which includes depositing a plurality of epitaxial stacks 420 on epitaxial growth substrates 320, wherein each epitaxial stack 420 contains a layer of epitaxial material 418 deposited over a layer of sacrificial material 404, and etching the layers of sacrificial material 404 while removing the layers of epitaxial material 418 from tiled growth substrate 300 during at least one ELO process.

In some embodiments, tiled growth substrate 300 may have 2, 3, 4, 5, 6, 10, 12, 20, 24, 50, 100, or more epitaxial stacks. Each layer of the epitaxial material 418 may have the same composition or different compositions. Similarly, each layer of the sacrificial material 404 may have the same composition or different compositions. Each layer of the epitaxial material 418 may contain multiple layers and may independently contain gallium arsenide, aluminum gallium arsenide, or derivatives thereof. Examples provide that each layer of the epitaxial material 418 may independently have a layer containing gallium arsenide and another layer containing aluminum gallium arsenide. In one embodiment, each layer of the epitaxial material 418 may independently contain buffer layer 406, passivation layer 408, gallium arsenide active layer 410, and passivation layer 412. In some examples, buffer layer 406 contains gallium arsenide, passivation layers 408 and 412 may each independently contain aluminum gallium arsenide, and active layer 410 may contain gallium arsenide.

In some embodiments, sacrificial layers 404 or material may be exposed to a wet etch solution during an ELO etch step. The wet etch solution may contain hydrofluoric acid, and further contain a surfactant and/or a buffer. In some example, sacrificial layers 404 or material may be etched during a wet etch process at a rate of about 0.3 mm/hr or greater, preferably, about 1 mm/hr or greater, and more preferably, about 5 mm/hr or greater.

In some alternative embodiments, sacrificial layers 404 or material may be exposed to an electrochemical etch during an ELO etch step. The electrochemical etch may include a biased process or a galvanic process. In another example, sacrificial layers 404 or material may be exposed to a vapor phase etch during an ELO etch step. The vapor phase etch includes exposing sacrificial layers 404 or material to hydrogen fluoride vapor. The ELO process as described herein may contain an etching process or an etching step such as a photochemical etch process, a thermally enhanced etch process, a plasma enhanced etch process, a stress enhanced etch process, derivatives thereof, or combinations thereof.

In another embodiment, a method for forming multiple epitaxial thin films during an epitaxial lift off process is provided which includes depositing a plurality of aluminum arsenide sacrificial layers simultaneously on a plurality of gallium arsenide growth surfaces disposed on a support substrate, wherein a single aluminum arsenide sacrificial layer is deposited on each gallium arsenide growth surface, and each of the gallium arsenide growth surfaces is separately disposed on the support substrate, next to each other, and a gap extends between and separates the gallium arsenide growth surfaces from each other.

The method further includes depositing a plurality of buffer layers simultaneously on the plurality of aluminum arsenide sacrificial layers. A single buffer layer may be deposited by CVD on each aluminum arsenide sacrificial layer. Subsequently, a plurality of gallium arsenide active layers are simultaneously grown or otherwise deposited on the plurality of buffer layers, wherein a single gallium arsenide active layer is deposited on each buffer layer.

A support film, handle, or tape may be disposed on or over the opposite side of the gallium arsenide active layers or the ELO film as the support substrate. The support film is used to stabilize the gallium arsenide active layers by maintaining compression and to hold the gallium arsenide active layers during the etching and removal steps of the ELO process, and thereafter. The ELO process includes etching the aluminum arsenide sacrificial layers while separating the gallium arsenide active layers from the gallium arsenide growth surfaces. During the etching process, the support film may be used to provide leverage and separate the ELO films from the epitaxial growth substrates row by row or all of the rows at the same time.

While the foregoing is directed to embodiments of the invention, other and further embodiments of the invention may be devised without departing from the basic scope thereof, and the scope thereof is determined by the claims that follow.

The invention claimed is:

1. A gallium arsenide substrate assembly, comprising:
    a support substrate comprising a coefficient of thermal expansion within a range from about $5 \times 10^{-6 \circ}$ C.$^{-1}$ to about $9 \times 10^{-6 \circ}$ C.$^{-1}$;
    an adhesion layer disposed on the support substrate; and
    at least two gallium arsenide growth substrates separately disposed on the adhesion layer and next to each other, wherein a gap extends between and separates the gallium arsenide growth substrates from each other.

2. The gallium arsenide substrate assembly of claim 1, wherein the coefficient of thermal expansion is within a range from about $5.2 \times 10^{-6 \circ}$ C.$^{-1}$ to about $8.5 \times 10^{-6 \circ}$ C.$^{-1}$.

3. The gallium arsenide substrate assembly of claim 1, wherein the at least two gallium arsenide growth substrates comprise 4 or more gallium arsenide growth substrates.

4. The gallium arsenide substrate assembly of claim 3, wherein the at least two gallium arsenide growth substrates comprise 12 or more gallium arsenide growth substrates.

5. The gallium arsenide substrate assembly of claim 1, wherein the support substrate comprises a material selected from the group consisting of niobium, niobium alloys, titanium carbide, magnesium silicate, steatite, tungsten carbide, tungsten carbide cermet, iridium, alumina, alumina ceramics, zirconium, zirconium alloys, zirconia, zirconium carbide, osmium, tantalum, hafnium, molybdenum, molybdenum alloys, oxides thereof, silicates thereof, alloys thereof, derivatives thereof, and combinations thereof.

6. The gallium arsenide substrate assembly of claim 1, wherein the support substrate has no porosity or substantially no porosity.

7. The gallium arsenide substrate assembly of claim 1, wherein the support substrate is resistant or substantially resistant to hydrogen fluoride or hydrofluoric acid.

8. The gallium arsenide substrate assembly of claim 1, wherein the adhesion layer comprises an optical adhesive or a UV-curable adhesive.

9. The gallium arsenide substrate assembly of claim 8, wherein the adhesion layer comprises a mercapto ester compound.

10. The gallium arsenide substrate assembly of claim 9, wherein the adhesion layer further comprises a material selected from the group consisting of butyl octyl phthalate, tetrahydrofurfuryl methacrylate, acrylate monomer, derivatives thereof, and combinations thereof.

11. The gallium arsenide substrate assembly of claim 1, wherein the adhesion layer comprises silicone or sodium silicate.

12. A gallium arsenide substrate assembly, comprising:
    an adhesion layer disposed on a support substrate; and
    at least two gallium arsenide growth substrates separately disposed on the adhesion layer and next to each other, wherein the support substrate comprises a coefficient of thermal expansion for providing a maximum strain of about 0.1% or less within the gallium arsenide growth substrates at a temperature of about 650° C. or less, and a gap extends between and separates the gallium arsenide growth substrates from each other.

13. The gallium arsenide substrate assembly claims 12, wherein the coefficient of thermal expansion is about $9 \times 10^{-6 \circ}$ C.$^{-1}$ or less.

14. The gallium arsenide substrate assembly of claim 13, wherein the coefficient of thermal expansion is within a range from about $5 \times 10^{-6 \circ}$ C$^{-1}$ to about $8 \times 10^{-6 \circ}$ C.$^{-1}$.

15. The gallium arsenide substrate assembly of claim 12, wherein the coefficient of thermal expansion is within a range from about $5.2 \times 10^{-6 \circ}$ C.$^{-1}$ to about $8.5 \times 10^{-6 \circ}$ C.$^{-1}$.

16. The gallium arsenide substrate assembly of claim 12, wherein the at least two gallium arsenide growth substrates comprise 4 or more gallium arsenide growth substrates.

17. The gallium arsenide substrate assembly of claim 16, wherein the at least two gallium arsenide growth substrates comprise 12 or more gallium arsenide growth substrates.

18. The gallium arsenide substrate assembly of claim 12, wherein the support substrate comprises a material selected from the group consisting of niobium, niobium alloys, titanium carbide, magnesium silicate, steatite, tungsten carbide, tungsten carbide cermet, iridium, alumina, alumina ceramics, zirconium, zirconium alloys, zirconia, zirconium carbide, osmium, tantalum, hafnium, molybdenum, molybdenum alloys, oxides thereof, silicates thereof, alloys thereof, derivatives thereof, and combinations thereof.

19. The gallium arsenide substrate assembly of claim 12, wherein the support substrate has no porosity or substantially no porosity.

20. The gallium arsenide substrate assembly of claim 12, wherein the support substrate is resistant or substantially resistant to hydrogen fluoride or hydrofluoric acid.

21. The gallium arsenide substrate assembly of claim 12, wherein the adhesion layer comprises an optical adhesive or a UV-curable adhesive.

22. The gallium arsenide substrate assembly of claim 21, wherein the adhesion layer comprises a mercapto ester compound.

23. The gallium arsenide substrate assembly of claim 22, wherein the adhesion layer further comprises a material selected from the group consisting of butyl octyl phthalate, tetrahydrofurfuryl methacrylate, acrylate monomer, derivatives thereof, and combinations thereof.

24. The gallium arsenide substrate assembly of claim 12, wherein the adhesion layer comprises silicone or sodium silicate.

* * * * *